United States Patent [19]

Hwu et al.

[11] Patent Number: 5,736,454
[45] Date of Patent: Apr. 7, 1998

[54] METHOD FOR MAKING A SILICON DIOXIDE LAYER ON A SILICON SUBSTRATE BY PURE WATER ANODIZATION FOLLOWED BY RAPID THERMAL DENSIFICATION

[75] Inventors: Jenn-Gwo Hwu; Ming-Jer Jeng, both of Taipei, Taiwan

[73] Assignee: National Science Council, Taipei, Taiwan

[21] Appl. No.: 822,593

[22] Filed: Mar. 20, 1997

[51] Int. Cl.$^6$ .................................................. H01L 21/316
[52] U.S. Cl. .................... 438/585; 438/591; 438/594; 438/770; 205/157; 205/333
[58] Field of Search ........................... 438/770, 594, 438/585, 591; 148/DIG. 118; 205/157, 333

[56] References Cited

U.S. PATENT DOCUMENTS

| | | | |
|---|---|---|---|
| 3,377,258 | 4/1968 | Schmidt et al. | 205/157 |
| 3,764,491 | 10/1973 | Schwartz | 205/157 |
| 3,890,169 | 6/1975 | Schwartz | 205/157 |
| 4,289,602 | 9/1981 | Sansregret | 438/585 |

OTHER PUBLICATIONS

Thin-Gate Oxides Prepared by Pure Wter Anodization Followed by Rapid Thermal Densification, Jeng et al., IEEE Electronic Device Letters, vol. 17, No. 12, Dec. 1996, pp. 575-577.

Enhanced nitrogen incorporation and improved breakdown endurance in nitrided gate oxides preparede by anodic oxidation followed by rapid thermal nitridation in $N_2O$, Jeng et al., Appl. Phys. Lett. 69(25), 16 Dec. 1996, pp. 1-3.

*Primary Examiner*—Charles L. Bowers, Jr.
*Assistant Examiner*—Matthew Whipple
*Attorney, Agent, or Firm*—Hitt Chwang & Gaines, P.C

[57] ABSTRACT

The present invention relates to a method for forming a silicon dioxide layer on a silicon substrate, which is suitable for use as a thin-gate oxide. The method includes conducting an electrolytic reaction at a room temperature such that a silicon dioxide layer is formed on a silicon substrate acting as an anode, wherein pure water is used as an electrolyte of the electrolytic reaction. The silicon dioxide layer is further subjected with a rapid thermal densification carried out in an inert gas atmosphere and at a temperature of 700°–1000° C. for a period of time such that the silicon dioxide layer formed on said silicon substrate is densified.

4 Claims, 5 Drawing Sheets

METHOD FOR MAKING A SILICON DIOXIDE LAYER ON A SILICON SUBSTRATE BY PURE WATER ANODIZATION FOLLOWED BY RAPID THERMAL DENSIFICATION

FIELD OF THE INVENTION

The present invention relates generally to a method for making a silicon dioxide layer on a silicon substrate, and more particularly to a method for forming a thin silicon dioxide layer on a silicon substrate by anodic oxidation at room temperature followed by rapid thermal densification or nitridation.

BACKGROUND OF THE INVENTION

High-quality thin-gate oxides are needed when device size becomes small in ultra large scale integration (ULSI) circuits. In recent years, many ways have been proposed to grow high-quality thin-gate oxide, or oxynitride oxide. However, there are some problems that unavoidably existed in using high-temperature processing. For example, doping redistribution may occur when the high-temperature duration is too long. Thus, a reduction of high-temperature processing time is indispensable. Recently, oxide films prepared by low-temperature processes, such as low-temperature chemical vapor deposition (LTCVD), are of interest. Although the quality of the low-temperature deposited oxide films is still not good enough for direct gate oxide application, it can be improved by a short-time densification at a proper high temperature or nitridation in $N_2O$ or $NH_3$. It is noted that anodic oxidation is also a low-temperature process to prepare oxides. The anodic oxides have the merit of less pinholes due to the self-readjustment nature of current conduction through the weak path in oxide during anodization. Therefore, it is believed that the anodic oxides should exhibit better oxide thickness uniformity than the conventional thermal oxides. This is important for very thin gate oxide.

SUMMARY OF THE INVENTION

In this invention, anodic oxidation followed by rapid thermal densification (AOD) at a temperature of 700°–1100° C. and in an inert gas atmosphere is proposed to prepare thin silicon oxides on silicon substrates. Said inert gas atmosphere preferably is a nitrogen-containing gas such as nitrogen, $N_2O$, NO and $NH_3$. It is believed that the rapid thermal densification carried out in $N_2O$, NO or $NH_3$ will result in the incorporation of nitrogen in the silicon oxide layer. It is supposed that this method can provide the advantages of uniformity and high breakdown field endurance for thin oxides. Pure de-ionized water is used as electrolyte during anodization. The rapid thermal system is used to densify the anodic oxide with the high temperature processing time as short as possible. It is observed that the AOD oxides exhibit a very low interface trap density. Interestingly, negative effective oxide trapped charges are found in AOD oxides which are helpful to retard the electron injection during stressing. From experimental results, it is found that AOD oxides show higher breakdown endurance than RTO oxides. The uniform interfacial property with less pinholes and negative charges existed in AOD oxides are responsible for the improved breakdown characteristics.

DETAILED DESCRIPTION OF THE INVENTION

The present invention discloses a method for forming a silicon dioxide layer on a silicon substrate. Said method comprises conducting an electrolytic reaction at a room temperature such that a silicon dioxide layer is formed on a silicon substrate acting as an anode, in which pure water is used as an electrolyte, and said electrolytic reaction is carried out with a current density ranging between 1 and 100 µA/cm$^2$; removing said silicon substrate from said electrolyte; and heating said silicon substrate in an inert gas atmosphere and at a temperature of 700°–1000° C. for a period of time such that said silicon dioxide formed on said silicon substrate is densified.

The method of the present invention has the following advantages. The thickness of the silicon dioxide layer grown can be easily controlled by selecting a suitable current density. The method of the present invention is brought about at a relatively low temperature (room temperature), and thus is able to prevent the problems caused by thermal stress, so that has a relatively low midgap interface trap density. In addition, the silicon dioxide layer formed by the anodic oxidation of the method of the present invention has an uniform thickness in view of the fact that the silicon dioxide layer so formed is capable of self-filling of the pinholes, and thus the breakdown characteristics and liability of the oxide layer is substantially improved. The method of the present invention can be applied in the fabrication of an integrated circuit for forming a field oxide layer or the oxide layer of a thin film transistor.

The invention will be further illustrated by the following example. The following examples are only meant to illustrate the invention, but not to limit it.

EXAMPLE 1
The effect of different current density

Figure 1:
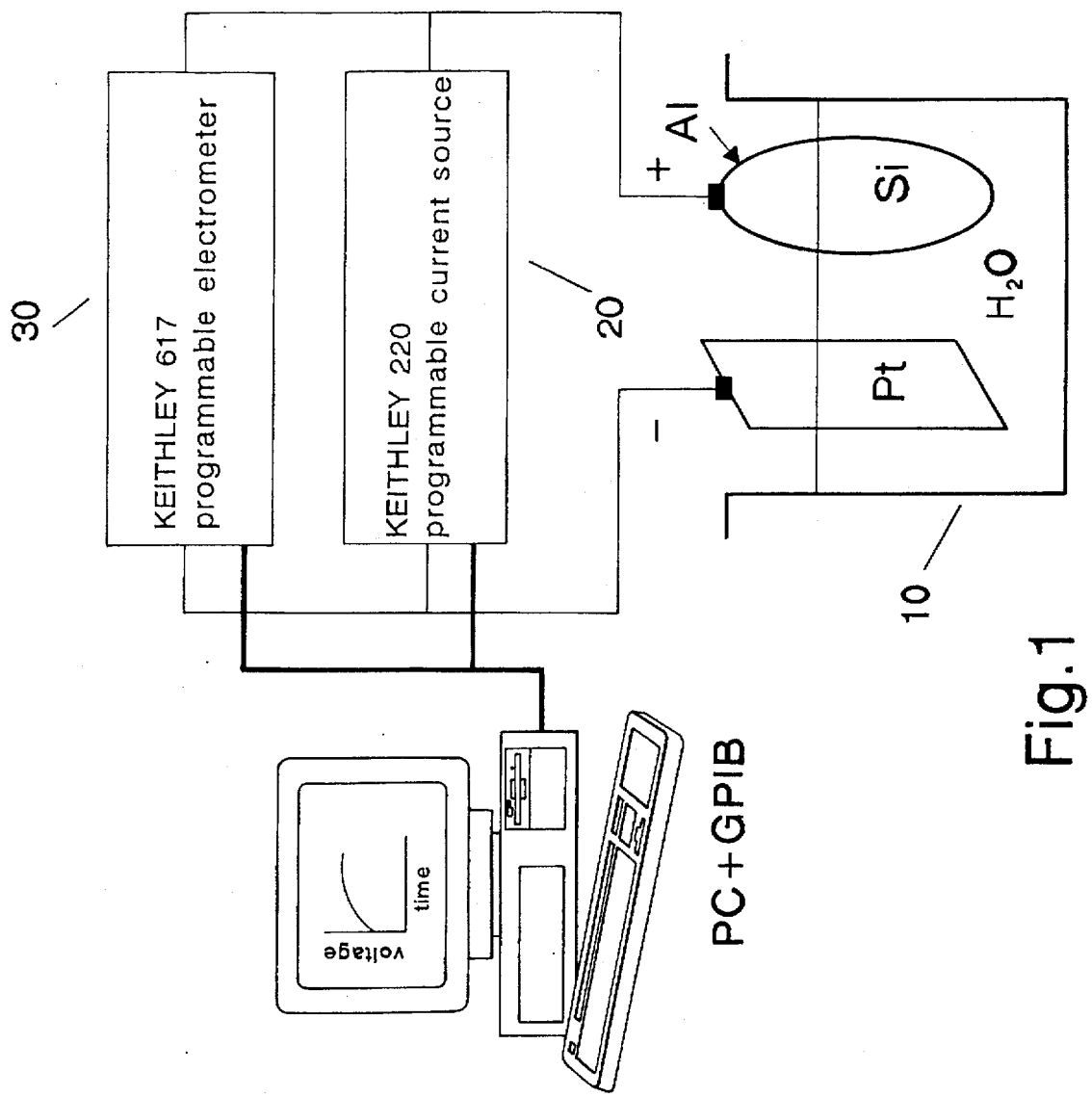
FIG. 1 is a schematic view of an electrolytic reaction system suitable for use in the present invention.

Boron-doped (100) silicon wafers with a resistivity of 1–10 Ω·cm were used as the substrates. After standard RCA cleaning of wafers, aluminum (Al) film was evaporated on the backside of the wafers to form the anodic contact (+) for anodization. As shown in FIG. 1, pure de-ionized water was introduced into in a vessel 10 as an electrolyte, platinum (Pt) used as a cathode plate (−) and the wafer were immersed in the de-ionized water. The anodization was carried out at a constant current density after the distance between the anode (+) and the cathode plate (+) and the area of the wafer immersed in the de-ionized water were adjusted. A personal computer (PC) equipped with a GPIB interface card which was connected with a KEITHLEY 220 programmable current source 20 were used to set the constant current density. A KEITHLEY 617 programmable electrometer 30 was also connected to the GPIB interface card, which transmits the signals of oxidation voltage to the PC at a predetermined time interval. The oxide thickness was determined by ellipsometry.

Table 1 lists the electrolytic reaction time for growing an oxide layer having a thickness of 60 Å under a constant current density. It can be seen from Table 1 that the oxidation rate is generally proportional to the current density. Therefore, the thickness of the oxide layer can be precisely controlled by appropriately selecting the current density.

TABLE 1

| Current density (µA/cm$^2$) | 5 | 10 | 20 | 30 | 50 |
|---|---|---|---|---|---|
| Reaction time (min) | 190 | 91 | 46 | 32 | 21 |

The silicon dioxide layers grown in accordance with the method of this example can be further treated with a rapid thermal densification or nitridation, whereby the refractive indexes thereof can be increased from about 1.400 to 1.460.

EXAMPLE 2
Fabrication of MOS capacitors and characteristics thereof

Boron-doped (100) silicon wafers with a resistivity of 20–50 Ω·cm were used as the substrates of MOS capacitors. After standard RCA cleaning of wafers, aluminum film was evaporated on the backside of the wafer to form the anodic contact for anodization. It is noted that the use of Al is not a fundamental issue. One can use a heavily doped bottom layer or a direct metal plate bonding as an alternative way to replace Al evaporation. Platinum was used as the cathode plate and pure de-ionized water was used as the electrolyte. The anodization was carried out at a constant current density of 10 µA/cm$^2$ for 30 min. The oxide thickness is controlled to be about 50 Å which is determined by ellipsometry. After removing the backside aluminum film, a lamp-heated rapid thermal treatment was used to densify the anodic oxides. The densification was performed in N$_2$ ambient at 950° C. for 15 seconds. In addition, rapid thermal oxidation (RTO) in O$_2$ ambient at 950° C. for 20 seconds was also performed to grow a RTO oxide with a thickness of about 50 Å for comparison. Aluminum films were then evaporated on the wafers and conventional photolithography was used to pattern the metal gates. Also, the evaporated aluminum films were used as back contacts of the MOS capacitors. Post-metallization anneal was performed at 400° C. for 10 minutes in N$_2$ ambient. In characterization, high-frequency and quasistatic C-V curves were measured to examine the electrical property of the oxides. The time-zero dielectric breakdown (TZDB) and time-dependent dielectric breakdown (TDDB) measurements were also performed to investigate the breakdown and trapping characteristics. It is noted that the breakdown field is defined by the division of breakdown voltage to oxide thickness in this example. The breakdown voltage is defined as the applied voltage across the oxide at which the current level through the oxide exceeds 1 µA.

Figure 2:
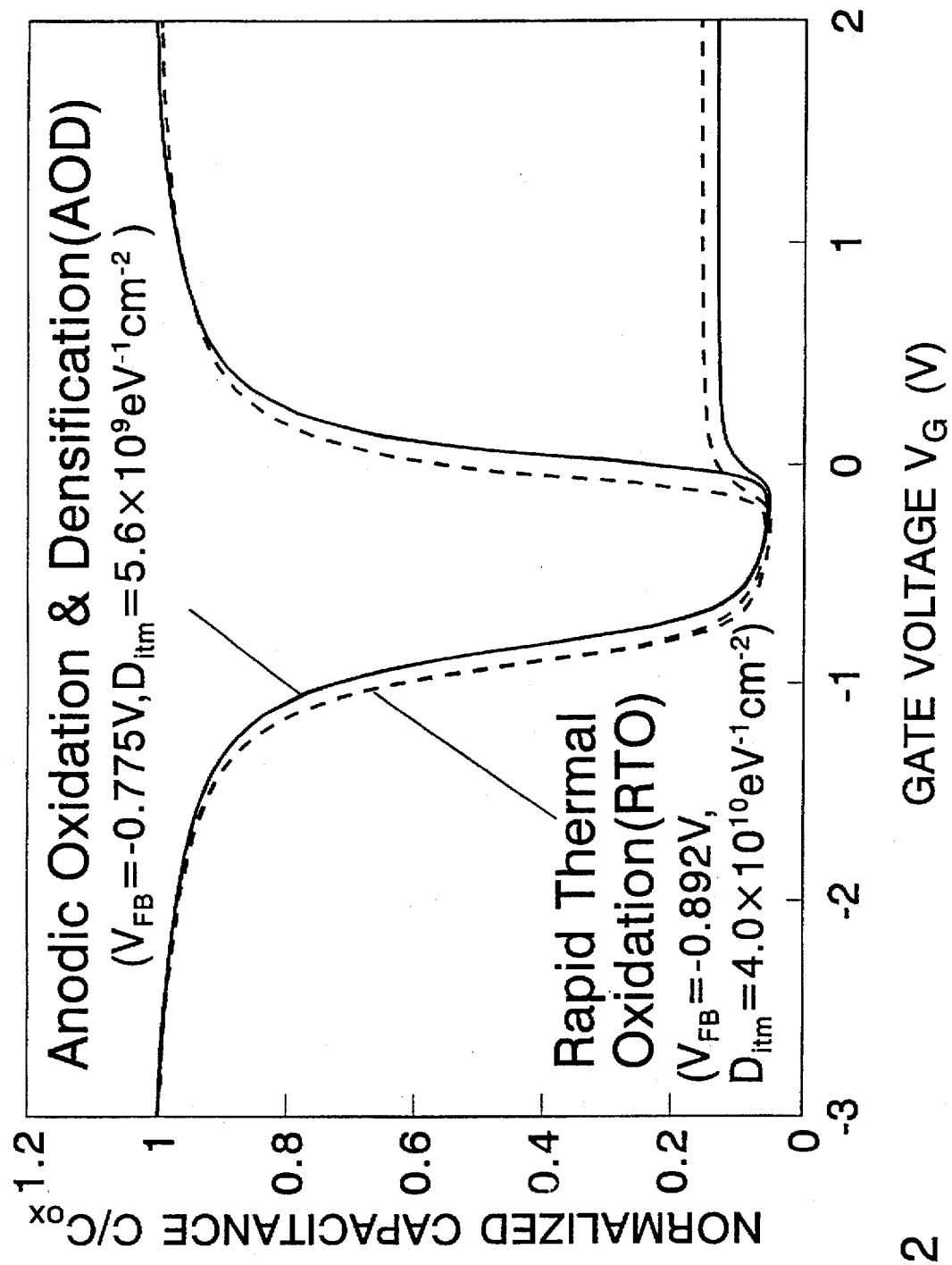
FIG. 2 shows two curves illustrating the high-low frequency capacitance-voltage (C-V) curves of the MOS capacitor made by using the silicon dioxide layer formed by the AOD method of the present invention as the dielectric layer and the MOS capacitor made by using the silicon dioxide layer formed by the conventional rapid thermal oxidation (RTO) technique as the dielectric layer, wherein the midgap interface trap density ($D_{itm}$) and flatband voltage ($V_{FB}$) of the two curves are also shown.

FIG. 2 shows the high-low frequency C-V curves of AOD and RTO oxides. It is clearly observed that the midgap interface trap density, $D_{itm}$, of the AOD oxide is smaller than that of RTO oxide. The flatband voltage, $V_{FB}$, of the AOD oxide is smaller than the ideal value, i.e., −0.89 V, which means negative effective oxide trapped charge of 1.42×10$^{11}$ cm$_{-2}$ existed. These pretrapped negative charges in oxide will retard the electron injection from metal gate during stressing in AOD oxides.

Figure 3A:
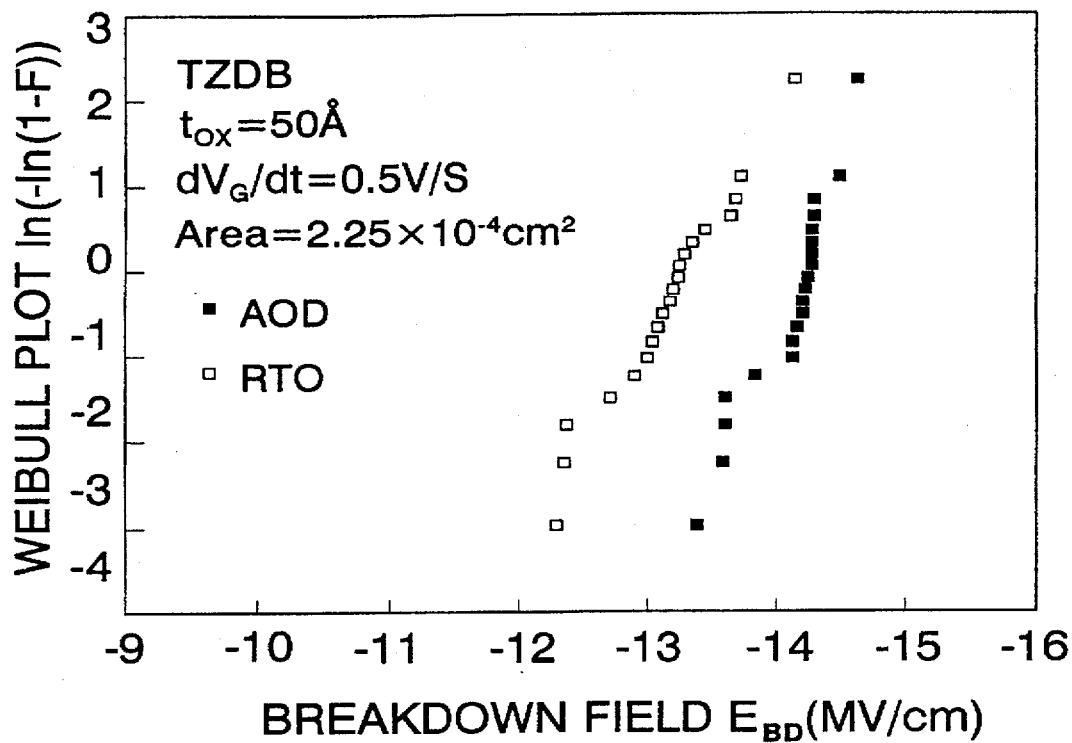
FIG. 3(a) is a Weibull plot illustrating the time-zero dielectric breakdown (TZDB) characteristics of the MOS capacitors made by using the silicon dioxide layers formed respectively by the AOD method of the present invention and the RTO method as the dielectric layers, with the silicon dioxide layers having a thickness ($T_{ox}$) of about 50 angstroms, wherein a stepped voltage was applied to the oxide layer having a gate area of $2.25 \times 10^{-4}$ cm$^2$ such that the stepped voltage was increased 0.5 volt every second ($dV_G/dt=0.5$ V).
Figure 3B:
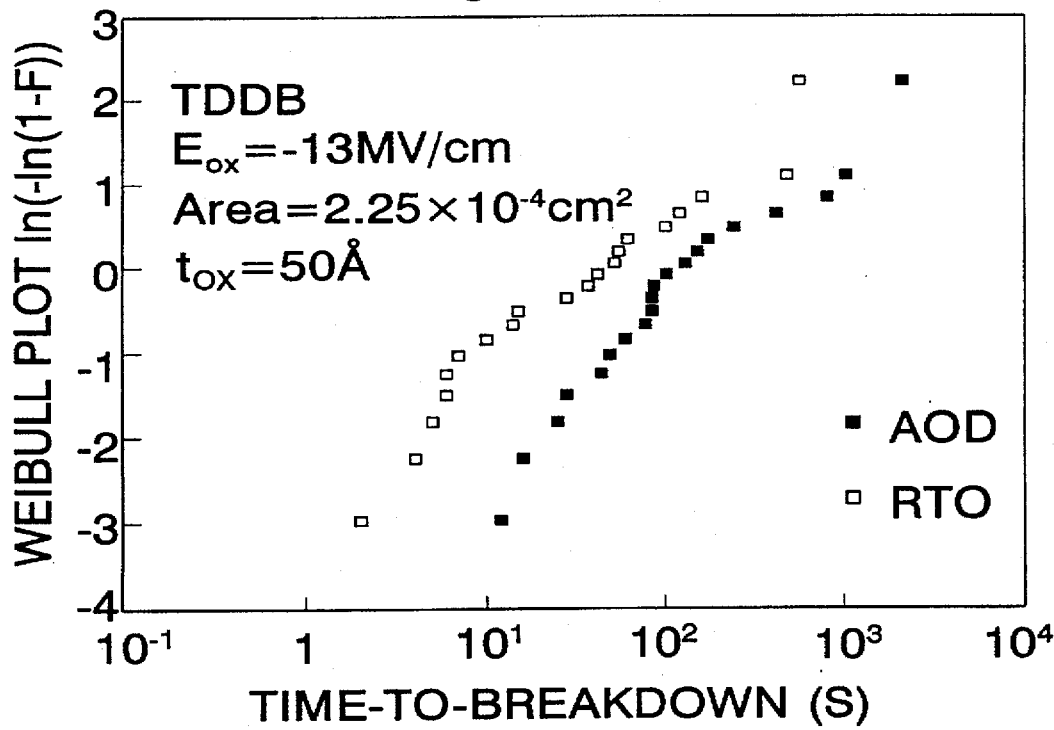
FIG. 3(b) is a Weibull plot illustrating the time-dependent dielectric breakdown (TDDB) characteristics of the MOS capacitors made by using the silicon dioxide layers formed respectively by the AOD method of the present invention and the RTO method as the dielectric layers, with the silicon dioxide layers having a thickness ($T_{ox}$) of about 50 angstroms, wherein a constant electric field stress of $E_{ox}=-13$ MV/cm was applied to the oxide layer having a gate area of $2.25 \times 10^{-4}$ cm$^2$.)

The Weibull plots of TZDB under staircase ramp voltage treatment for the capacitors with AOD and RTO oxides are shown in FIG. 3(a). Clearly, the AOD oxides show higher breakdown field than the RTO oxides. FIG. 3(b) shows the Weibull plots of TDDB characteristics under a constant electric field stress of $E_{ox}$=−13 MV/cm for the capacitors with AOD and RTO oxides. The AOD oxides show better endurance characteristics than the RTO oxides.

EXAMPLE 3
Fabrication of MOS capacitors and characteristics thereof

Boron-doped (100) silicon wafers with a resistivity of 1–10 Ω·cm are used as the substrates of metal-oxide semiconductor (MOS) capacitors. After standard RCA cleaning of wafers, aluminum film was evaporated on the backside of the wafer to form the anodic contact for anodization. Platinum was used as the cathode plate and pure de-ionized water was used as the electrolyte. The anodic oxidation (ANO) was carried out at a constant current density of 10 µA/cm$^2$ for 100 min. The oxide thickness is about 88 Å. After removing the backside aluminum film, a lamp-heated rapid thermal treatment was used to densify and nitride the anodic oxides. The densification and nitridation were performed in N$_2$O ambient at 950° C. for 30 seconds. The final oxide thickness was about 100 Å. In addition, rapid thermal oxidation (RTO) in $O_2$ ambient at 950° C. for 110 seconds was also performed to grow a RTO oxide with a thickness of about 90 Å for comparison. The same $N_2O$ treatment was performed on the RTO oxide. Aluminum films were then evaporated on the wafers and conventional photolithography was used to pattern the metal gates. The evaporated aluminum films were also used as back contacts of the MOS capacitors. Post-metallization anneal was performed at 400° C. for 10 min in $N_2$ ambient. In characterication, high-frequency and quasi-static capacitance-voltage (C-V) curves were measured to examine the electrical property of the oxides. The time-zero dielectric breakdown (TZDB) and time-dependent dielectric breakdown (TDDB) measurements were also performed to investigate the breakdown and trapping characteristics. It is noted that the breakdown field is defined by the division of breakdown voltage to oxide thickness in this example. The breakdown voltage is defined as the applied voltage across the oxide at which the current level through the oxide exceeds 1 μA.

Figure 4:
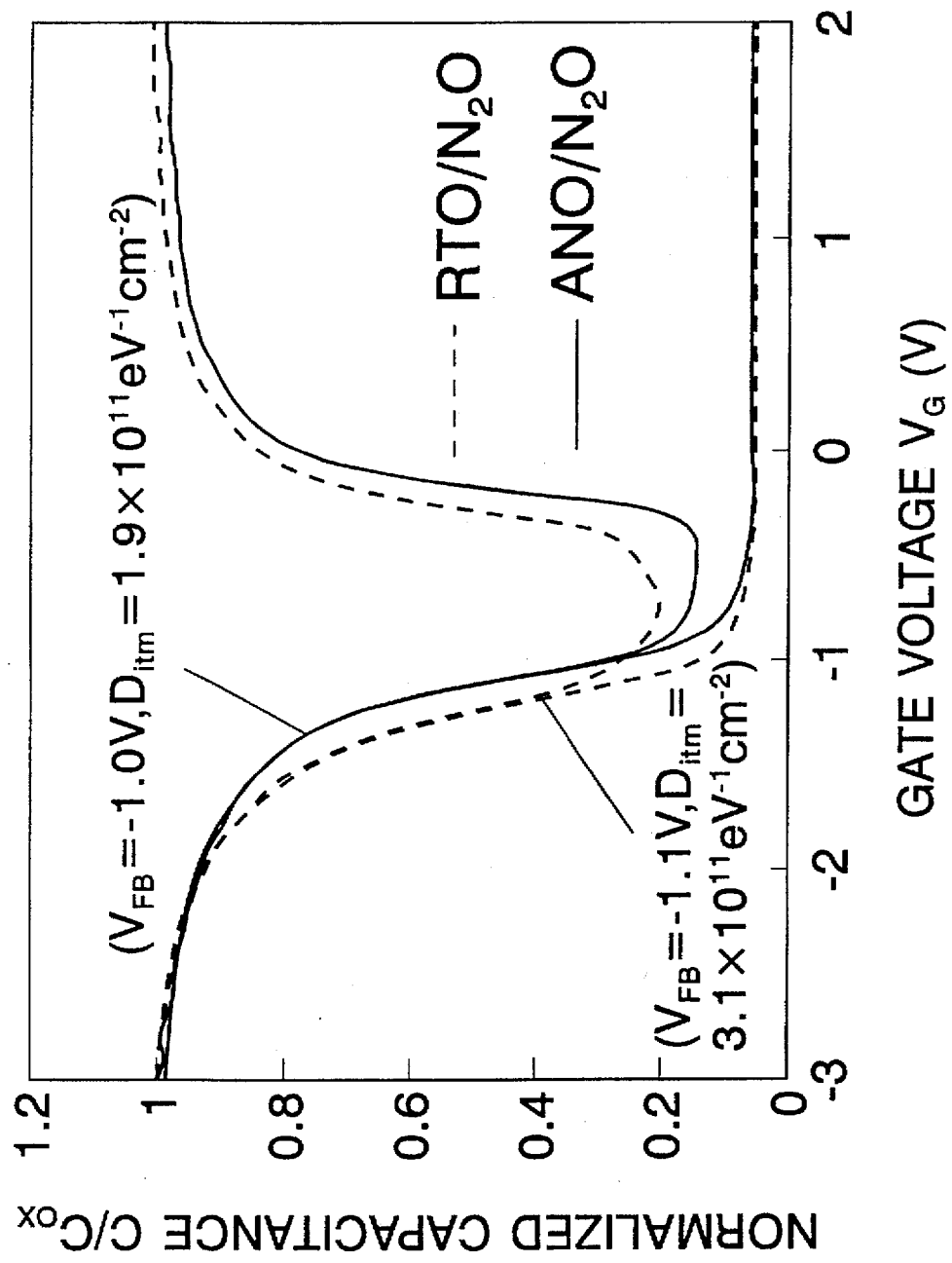
FIG. 4 shows two curves illustrating the high-low frequency capacitance-voltage (C-V) curves of the MOS capacitor made by using the silicon dioxide layer formed by the anodic oxidation (ANO) followed by rapid thermal densification in $N_2O$ of the present invention as the dielectric layer and the MOS capacitor made by using the silicon dioxide layer formed by the conventional rapid thermal oxidation (RTO) technique followed by rapid thermal densification in $N_2O$ as the dielectric layer, wherein the midgap interface trap density ($D_{itm}$) and flatband voltage ($V_{FB}$) of the two curves are also shown.

FIG. 4 shows the high-low frequency C-V curves of RTO/$N_2O$ and ANO/$N_2O$ nitrided oxides. Obviously, both the midgap interface trap density, $D_{itm}$, and the flatband voltage, $V_{FB}$, of ANO/$N_2O$ nitrided oxides are smaller than those of RTO/$N_2O$ oxides. It is noted that the flatband voltage of RTO and ANO oxides before $N_2O$ nitridation are −0.89 and −0.71 V, respectively. After $N_2O$ nitridation, the absolute value of the negative flatband voltage shift in ANO/$N_2O$ nitrided oxides, 0.29 V, is larger than that in RTO/$N_2O$ nitrided oxides, 0.21 V. The flatband voltage of room temperature anodic oxides before nitridation is smaller than the ideal value, i.e., −0.88 V, which means some negative oxide trapped charges exist. It is believed that these negative charges are related to hydrogen related defects. These defects in ANO oxide can be largely eliminated by the incorporation of nitrogen as can be seen from the large negative flatband voltage shift in C-V curves after nitridation.

Figure 5A:
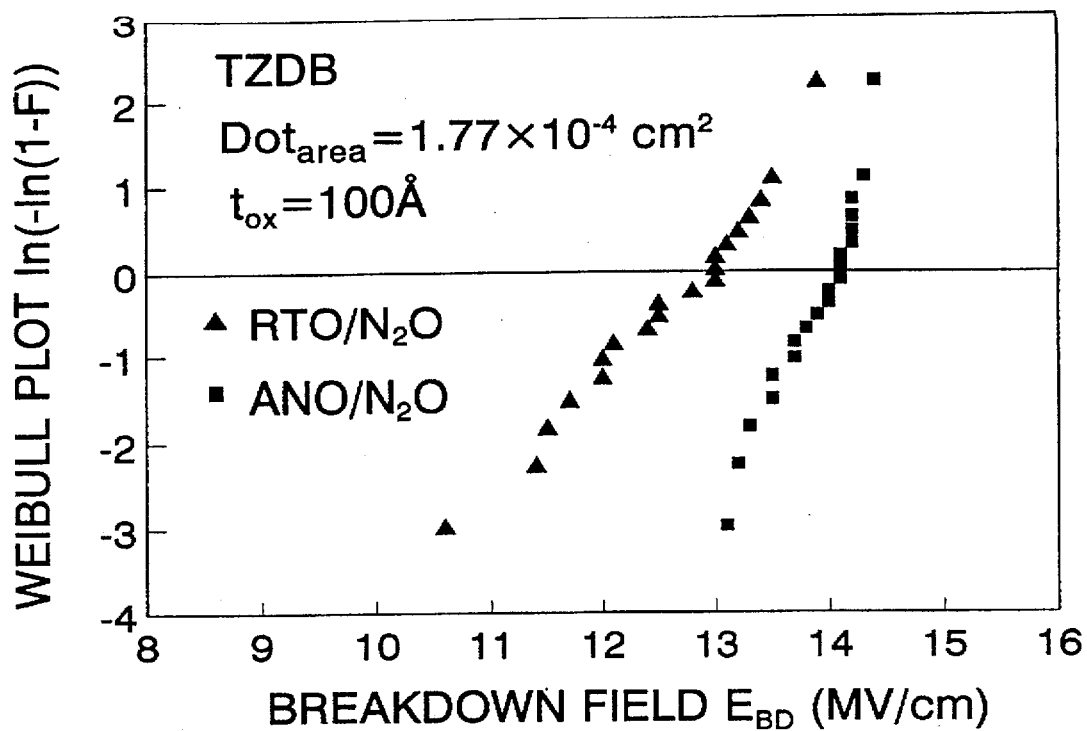
FIG. 5(a) is a Weibull plot illustrating the time-zero dielectric breakdown (TZDB) characteristics of the MOS capacitors made by using the silicon dioxide layers formed respectively by the ANO/$N_2O$ method of the present invention and the RTO/$N_2O$ method as the dielectric layers, with the silicon dioxide layers having a thickness ($T_{ox}$) of about 100 angstroms, wherein a stepped voltage was applied to the oxide layer having a gate area of $1.77 \times 10^{-4}$ cm$^2$ such that the stepped voltage was increased 0.5 volt every second ($dV_G/dt=0.5$ V).
Figure 5B:
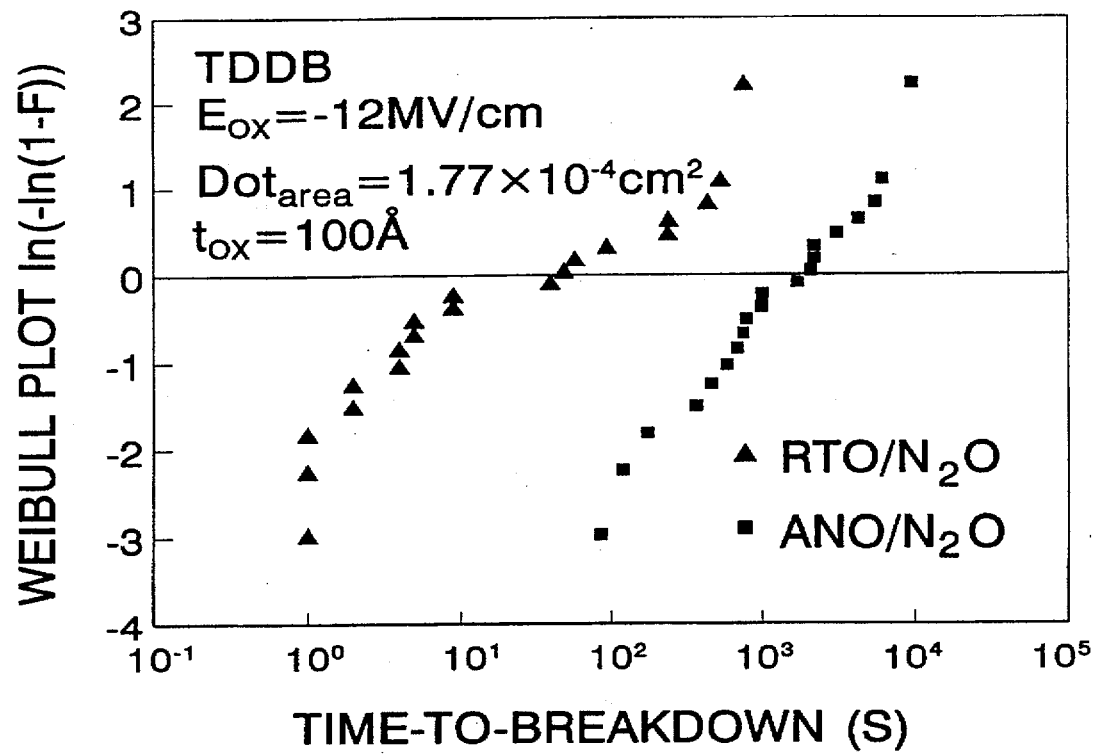
FIG. 5(b) is a Weibull plot illustrating the time-dependent dielectric breakdown (TDDB) characteristics of the MOS capacitors made by using the silicon dioxide layers formed respectively by the ANO/$N_2O$ method of the present invention and the RTO/$N_2O$ method as the dielectric layers, with the silicon dioxide layers having a thickness ($T_{ox}$) of about 100 angstroms, wherein a constant electric field stress of $E_{ox}=-12$ MV/cm was applied to the oxide layer having a gate area of $1.77 \times 10^{-4}$ cm$^2$.

The Weibull plots of TZDB for the capacitors with ANO/$N_2O$ and RTO/$N_2O$ nitrided oxides are shown in FIG. 5(a). Clearly, the ANO/$N_2O$ nitrided oxides show a higher breakdown field endurance than the RTO/$N_2O$ nitrided oxides. This is possibly due to the fact that ANO/$N_2O$ nitrided oxides have fewer pinholes and good uniformity in thickness so that the breakdown field is improved. FIG. 5(b) shows the Weibull plots of TDDB for ANO/$N_2O$ and RTO/$N_2O$ nitrided oxides tested under a constant electric field of $E_{ox}$=−12 MV/cm. Clearly, the ANO/$N_2O$ nitrided oxides show higher breakdown endurance than the RTO/$N_2O$ nitrided oxides. For this observation, it is supposed that ANO/$N_2O$ nitrided oxide has good interfacial property and strong interfacial strained bonds at the Si/$SiO_2$ interface. Therefore, it is more resistant to hot electron injection than the RTO/$N_2O$ nitrided oxide.

Having thus described the present invention, which is now deemed appropriate for Letters Patent is set out in the following appended claims.

What is claimed is:

1. A method for forming a silicon dioxide layer on a silicon substrate comprising conducting an electrolytic reaction at a room temperature such that a silicon dioxide layer is formed on a silicon substrate acting as an anode, in which pure water is used as an electrolyte, and said electrolytic reaction is carried out with a current density ranging between 1 and 100 μA/cm$^2$; removing said silicon substrate from said electrolyte; and heating said silicon substrate in an inert gas atmosphere and at a temperature of 700°–1000° C. for a period of time such that said silicon dioxide formed on said silicon substrate is densified.

2. The method according to claim 1, wherein said inert gas atmosphere is a nitrogen-containing gas.

3. The method according to claim 2, wherein said nitrogen-containing gas is $N_2$, $N_2O$, NO or $NH_3$.

4. The method according to claim 1, wherein said current density is 10 μA/cm$^2$.

* * * * *